(12) United States Patent
Song et al.

(10) Patent No.: US 8,426,880 B2
(45) Date of Patent: Apr. 23, 2013

(54) SEMICONDUCTOR LIGHT EMITTING DEVICE AND METHOD OF MANUFACTURING THE SAME

(75) Inventors: Ho Young Song, Gyunggi-do (KR); Dong Yu Kim, Gwangju (KR); Jeong Woo Park, Busan (KR); Yong Chun Kim, Gyunggi-do (KR); Hyung Ky Back, Gyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 235 days.

(21) Appl. No.: 12/155,877

(22) Filed: Jun. 11, 2008

(65) Prior Publication Data

US 2009/0001398 A1    Jan. 1, 2009

(30) Foreign Application Priority Data

Jun. 15, 2007    (KR) .................. 10-2007-0058981

(51) Int. Cl.
*H01L 33/00* (2010.01)
(52) U.S. Cl.
USPC .............. 257/98; 257/79; 257/E33.068
(58) Field of Classification Search .......... 257/79, 257/98, E33.068
See application file for complete search history.

(56) References Cited

U.S. PATENT DOCUMENTS

| 2004/0206969 | A1 | 10/2004 | Orita |
| 2004/0241421 | A1* | 12/2004 | Ootsuka et al. ............. 428/323 |
| 2006/0186424 | A1* | 8/2006 | Fujimoto et al. ............. 257/98 |
| 2009/0236629 | A1* | 9/2009 | Nishikawa et al. ........... 257/103 |

FOREIGN PATENT DOCUMENTS

| JP | 2005-331868 | * 12/2005 |
| KR | 10-2007-0003440 A | 1/2007 |
| WO | WO 2006/101225 A1 | 9/2006 |
| WO | WO 2007/007774 | * 1/2007 |

OTHER PUBLICATIONS

Korean Office Action, with English Translation, issued in Korean Patent Application No. KR 10-2007-0058981, mailed May 23, 2008.

* cited by examiner

*Primary Examiner* — Zandra Smith
*Assistant Examiner* — Jamie C Niesz
(74) *Attorney, Agent, or Firm* — McDermott Will & Emery LLP

(57) ABSTRACT

There are provided a semiconductor light emitting device that can be manufactured by a simple process and has excellent light extraction efficiency and a method of manufacturing a semiconductor light emitting device that has high reproducibility and high throughput. A semiconductor light emitting device having a substrate and a lamination in which a first conductivity type semiconductor layer, an active layer, and a second conductivity type semiconductor layer are sequentially laminated onto the substrate according to an aspect of the invention includes a silica particle layer; and an uneven part formed at a lower part of the silica particle layer.

7 Claims, 6 Drawing Sheets

SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application No. 2007-0058981 filed on Jun. 15, 2007, in the Korean Intellectual Property Office, the disclosure of which is incorporated herein by reference.

BACKGROUND OF THE INVENTION

1. Field of the Invention

The present invention relates to a semiconductor light emitting device and a method of manufacturing the same, and more particularly, to a semiconductor light emitting device that can be manufactured by using a simple process and has excellent light extraction efficiency and a method of manufacturing the same that can obtain high reproducibility and high throughput.

2. Description of the Related Art

Semiconductor light emitting devices include materials that emit light. For example, light emitting diodes (LEDs) are devices that use diodes, to which semiconductors are bonded, convert energy generated by recombination of electrons and holes into light, and emit light. The semiconductor light emitting devices are being widely used as lighting, display devices, and light sources. In consideration of energy savings and the protection of environment, development of semiconductor light emitting devices has been expedited in that they can emit light having desired wavelength with low power consumption and prevent emission of environmental hazardous substances such as mercury.

In particular, the widespread use of cellular phone keypads, side viewers, and camera flashes, which use GaN-based light emitting diodes that have been actively developed and widely used in recent years, contributes to the active development of general illumination that uses light emitting diodes. Applications of the light emitting diodes, such as backlight units of large TVs, headlights of cars, and general illumination, have advanced from small portable products to large products having high power, high efficiency, and high reliability. Therefore, there has been a need for light sources that have characteristics appropriate for the corresponding products.

GaN-based LEDs have relatively high internal quantum efficiency and thus have high efficiency in terms of light generation. However, since the GaN-based LEDs have a higher refractive index (2.3 to 2.8) than peripheral materials, they have low light extraction efficiency. Therefore, in the general GaN-based LED, a considerable amount of light generated in a light emission layer cannot be extracted to the outside of the LED but disappears inside the LED.

In order to overcome said drawback, a technique that gives texture to a substrate or the surface corresponding to a path along which photoelectrons move or a technique that forms periodic patterns is introduced. However, the techniques are limited in terms of reproducibility and high throughput.

FIG. 1 is a cross-sectional view illustrating a semiconductor light emitting device 1 having a patterned surface according to the related art. The semiconductor light emitting device 1 includes a substrate 10, semiconductor layers 20 and 40 having different conductivities from each other, and an active layer 30 formed between the semiconductor layers 20 and 40 to generate light. In FIG. 1, the semiconductor layers 20 and 40 having different conductivities are referred to as a first conductivity-type semiconductor layer 20 and a second conductivity-type semiconductor layer 40.

Non-periodic roughening is performed on the surface of the semiconductor light emitting device 1, that is, an outer surface in a path along which the generated light moves. Since the non-periodic roughening is formed at the surface thereof, light moving inside the semiconductor light emitting device 1 finally satisfies extraction conditions and is extracted to the outside of the semiconductor light emitting device 1 (Lout). The non-periodic roughening is formed by various methods. For example, wet or dry etching may be performed by using a photo mask or a metal dot mask to obtain non-periodic roughening. In a case of the metal dot mask, a metal dot is formed at a high heat treatment temperature of 600° C. or more. When a metal dot is formed of Mg, Mg ions are deactivated, which increases Vf and reduces luminance. Further, it is difficult to remove the remnant of metal chloride formed at the etched surface during dry etching. In a case of photolithography technique, an etching mask can be relatively easily formed. However, expensive equipment needs to be used to form a pattern of a similar size to the wavelength.

Therefore, there has been a need for a method of simply improving light extraction efficiency of the semiconductor light emitting device at low costs.

SUMMARY OF THE INVENTION

An aspect of the present invention provides a semiconductor light emitting device that can be manufactured by a simple process and has excellent light extraction efficiency.

An aspect of the present invention also provides a method of manufacturing a semiconductor light emitting device that can obtain high reproducibility and high throughput.

According to an aspect of the present invention, there is provided a semiconductor light emitting device having a substrate and a lamination in which a first conductivity type semiconductor layer, an active layer, and a second conductivity type semiconductor layer are sequentially laminated onto the substrate, the semiconductor light emitting device including: a silica particle layer; and an uneven part formed at a lower part of the silica particle layer.

The substrate may be any one of a sapphire substrate, a GaN substrate, a SiC substrate, and a ZnO substrate. The silica particle layer may be a monolayer.

The silica particle may have a diameter in the range of 100 to 1000 nm.

The silica particle layer may be formed between the substrate and the first conductivity type semiconductor layer, and the uneven part may be formed at the surface of the substrate.

The uneven part may have a cylindrical shape or a hemispherical shape.

According to another aspect of the present invention, there is provided a semiconductor light emitting device having a substrate and a lamination in which a first conductivity type semiconductor layer, an active layer, and a second conductivity type semiconductor layer are sequentially laminated onto the substrate, the semiconductor light emitting device including: a silica particle layer formed at the substrate.

According to still another aspect of the present invention, there is provided a method of manufacturing a semiconductor light emitting device, the method including: forming a silica particle layer at a substrate; etching the substrate by using the silica particle layer as a mask to form an uneven part on the substrate; and sequentially laminating the first conductivity type semiconductor layer, the active layer, and the second conductivity type semiconductor layer onto the substrate.

The forming a silica particle layer may include: laminating a plurality of self assembly monolayers having electric charges with different polarities at the substrate; and forming the silica particle layer at the plurality of self assembly monolayers by using silica colloids.

The etching may be dry etching using plasma.

The method may further include removing silica particles after forming the uneven part.

According to yet another aspect of the present invention, there is provided a method of manufacturing a semiconductor light emitting device, the method including: sequentially laminating a first conductivity type semiconductor layer, an active layer, and a second conductivity type semiconductor layer onto a substrate; forming a silica particle layer at the second conductivity semiconductor layer; etching the lamination by using the silica particle layer as a mask to form an uneven part in the second conductivity semiconductor layer; and removing silica particles.

The forming a silica particle layer may include: laminating a plurality of self assembly layers having electric charges with different polarities onto the second conductivity type semiconductor layer; and forming the silica particle layer at the plurality of self assembly monopoly layers by using silica colloids.

The etching may be dry etching using plasma.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
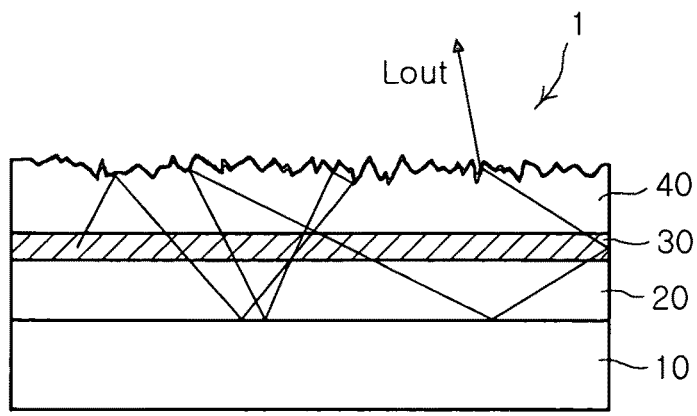
FIG. 1 is a cross-sectional view illustrating a semiconductor light emitting device that has a patterned surface according to the related art.

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. Also, in the drawings, the same reference numerals are used throughout to designate the same components.

Figure 2:
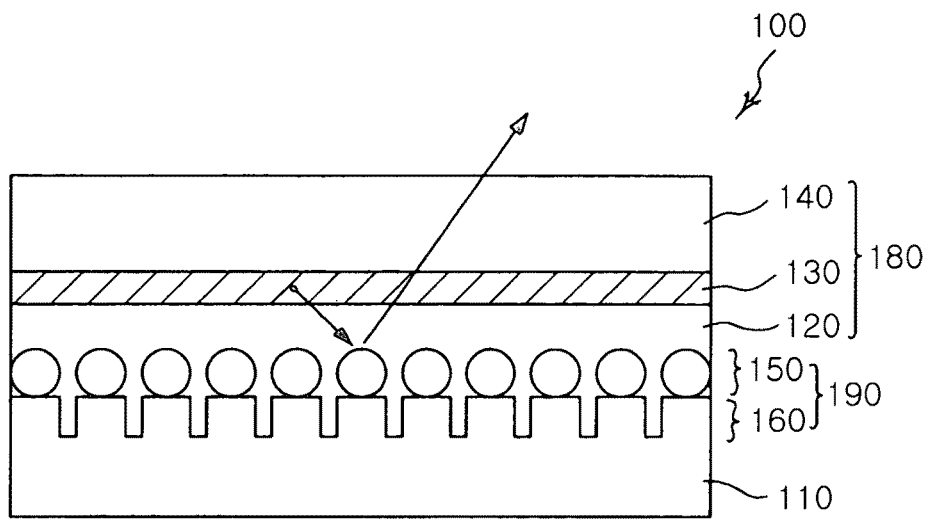
FIG. 2 is a cross-sectional view illustrating a semiconductor light emitting device according to an exemplary embodiment of the present invention.

FIG. 2 is a cross-sectional view illustrating a semiconductor light emitting device according to an exemplary embodiment of the invention. A semiconductor light emitting device 100 according to the embodiment of the invention includes a substrate 110 and a lamination 180 in which a first conductivity-type semiconductor layer 120, an active layer 130, and a second conductivity type semiconductor layer 140 are sequentially laminated onto the substrate 110. The semiconductor light emitting device 100 further includes a patterned layer 190 that has a silica particle layer 150 and an uneven part 160 formed at a lower part of the silica particle layer 150.

The substrate 110 may be a growth substrate used to grow semiconductor layers of the lamination 180 or a support substrate that supports the lamination 180. A non-conductive substrate, which is formed of, for example, sapphire or spinel ($MgAl_2O_4$), or a conductive substrate, which is formed of, for example, SiC, Si, ZnO, GaAs, and GaN, may be used as the substrate 110.

In particular, in the embodiment of the invention, the substrate 110 may be a sapphire substrate. The sapphire substrate is used as a growth substrate since it has a relatively similar crystal lattice constant with that of a semiconductor layer. However, since the sapphire substrate has high strength, it is difficult to form an uneven part on the sapphire substrate. Therefore, a method of patterning the surface may be complicated and require expensive equipment. According to the embodiment of the invention, however, it is possible to easily form the uneven surface of the sapphire substrate by forming the silica particle layer 150 on the surface of the sapphire substrate.

Preferably, a buffer layer (not shown) may be further included between the substrate 110 and the lamination 180. The buffer layer (not shown) may be a multilayer formed of a GaN-based material or a GaN/SiC-based material. A GaN-based buffer has a growth temperature in the range of 200 to 900° C. A SiC-based buffer has a growth temperature in the range of 500 to 1500° C. When the buffer layer (not shown) is grown under these conditions, the buffer layer (not shown) having good quality can be formed. Therefore, it is possible to obtain layers grown at the buffer layer (not shown) that are thin films having sufficient surface roughness.

The first conductivity-type semiconductor layer 120, the active layer 130, and the second conductivity type semiconductor layer 140 are sequentially laminated onto the substrate 110 to thereby form the lamination 180. Each of the semiconductor layers 120 and 140 is formed of a semiconductor, for example, a GaN-based semiconductor, a ZnO-based semiconductor, a GaAs-based semiconductor, a GaP-based semiconductor, and a GaAsP-based semiconductor. The semiconductor layers 120 and 140 may be realized as an n-type semiconductor layer and a p-type semiconductor layer, respectively. The semiconductor layers may be formed by using molecular beam epitaxy (MBE). In addition, the semiconductor layers may be formed of a semiconductor that is appropriately selected from the group consisting of a III-V semiconductor, a II-VI semiconductor, and Si.

Impurities of the n-type semiconductor layer may be any one selected from Si, Ge, and Sn. Preferably, Si may be used. Impurities of the p-type semiconductor layer may be any one selected from Mg, Zn, and Be. Preferably, Mg may be used.

The active layer 130 activates light emission. The active layer 130 is formed by using a material that has a smaller energy band gap than each of the first conductivity-type semiconductor layer 120 and the second conductivity type semiconductor layer 140. For example, when each of the first conductivity-type semiconductor layer 120 and the second conductivity type semiconductor layer 140 may be formed of a GaN-based compound semiconductor, the active layer 130 may be formed by using an InGaN-based compound semiconductor that has a smaller energy band gap than the GaN-based compound semiconductor. At this time, in consideration of characteristics of the active layer 130, the active layer 130 may not be doped with impurities. Wavelength or quantum efficiency may be controlled by adjusting the height of a barrier, the thickness of a well layer, composition, and the number of wells.

Though not directly shown in the semiconductor light emitting device 100 of FIG. 2, an n-type electrode and a p-type electrode may be formed to electrically connect the semiconductor layers 120 and 140, respectively, to an external power source. Each of the electrodes (not shown) may be formed of metal. For example, the n-type electrode may be formed of Ti, and the p-type electrode may be formed of Pd or Au.

The semiconductor light emitting device 100 includes the patterned layer 190 that includes the silica particle layer 150 and the uneven part 160 formed at a lower part of the silica particle layer 150. In the specification, the lower part of the uneven part 160 refers to a surface adjacent to the substrate 110 between both surfaces of the silica particle layer 150 on the basis of the substrate 110. The patterned layer 190 may be located at any positions as long as they can increase light extraction efficiency of the semiconductor light emitting device 100. For example, as shown in FIG. 2, the patterned layer 190 may be formed at the substrate. As described above, when the buffer layer (not shown) is formed at the semiconductor light emitting device 100, the patterned layer 190 may be formed between the buffer layer (not shown) and the first conductivity-type semiconductor layer 120.

In general, silica particles have a spherical shape. Further, the silica particles have a much lower refractive index (1.4 or below) than that of GaN. Therefore, when light generated from the active layer 130 toward the substrate 110 reaches the spherical surface of the silica particles, the silica particles perform diffused reflection of the light so that the light moves toward a light emitting surface.

Therefore, when the silica particles are formed at the substrate 110, light extraction efficiency increases. At the same time, since the silica particles have excellent thermal stability, the silica particles maintain shape and characteristics thereof even at high growth temperature by using MOCVD. Stress caused by a difference in lattice constant between the substrate 110 and the GaN layer may be reduced by appropriately controlling the density of the silica particles to thereby improve crystallization.

Preferably, the silica particle layer 150 is a monolayer. Since the silica particle layer 150 serves as a mask during a patterning process, the silica particle layer 150 is formed into a monolayer but not a multilayer. The size of the silica particles inside the silica particle layer 150 may be controlled in consideration of the size of patterns to be formed on the substrate. In consideration of the wavelength of light generated in the semiconductor light emitting device 100, it is preferable that the diameter of the silica particles be in the range of 100 to 1000 nm.

The substrate 110 formed at the lower part of the silica particle layer 150 is patterned by using the silica particle layer 150 to thereby form the uneven part 160. The patterned layer 190 is formed between the silica particles of the silica particle layer 150. The uneven part 160 may have a cylindrical shape or a hemispheric shape. The shape of the uneven part 160 may be controlled by appropriately selecting etching selectivity.

FIGS. 3A to 3D are views illustrating a method of manufacturing the semiconductor light emitting device of FIG. 2. Hereinafter, a description thereof will be made with reference to FIGS. 2 to 3D.

Figure 3A:
FIGS. 3A to 3D are views illustrating a method of manufacturing the semiconductor light emitting device of FIG. 2.

The substrate 110, shown in FIG. 3A, is prepared to manufacture the semiconductor light emitting device according to the embodiment of the invention. The silica particle-layer 150 is formed at the prepared substrate 110 before the first conductivity-type semiconductor layer 120 is formed.

The silica particle layer 150 is realized as a monolayer since the silica layer 150 is preferably a monolayer formed of silica particles. The silica particle layer 150 may be formed at the substrate 110 by using weak electrical connection using an electrolyte. A method of forming the silica particle layer 150 will be described below with reference to FIGS. 4A to 4C.

Figure 3B:
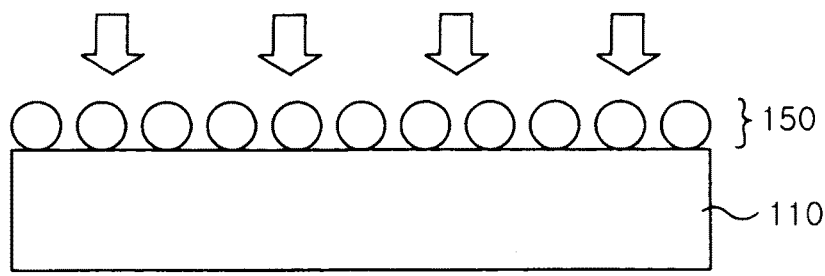
Figure 3C:
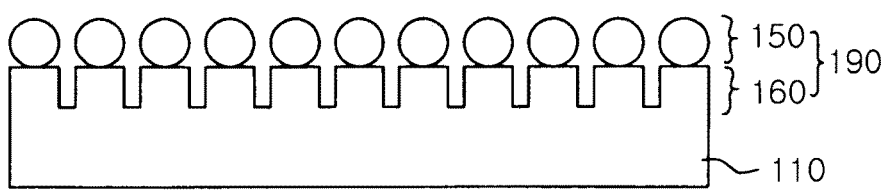
Figure 3D:
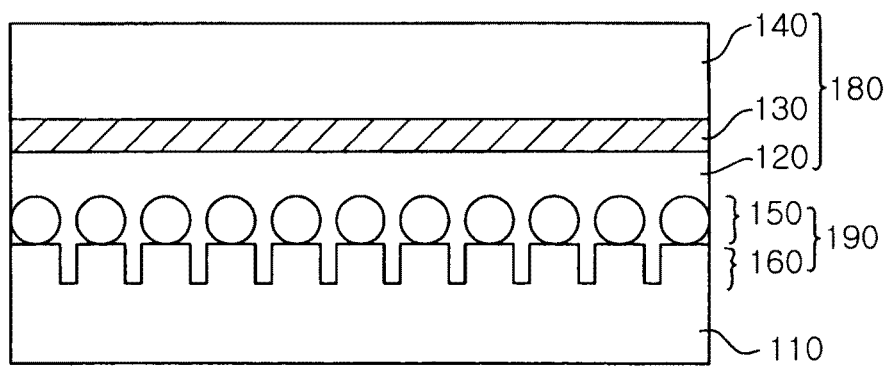

When the silica particle layer 150 is formed, the substrate is etched by using the silica particle layer 150 as a mask. Any etching method using the silica particle layer 150 may be used. As shown in FIG. 3B, plasma (indicated by an arrow) is applied to the silica particle layer 150 on the substrate 110 to perform dry etching of the substrate 110. In FIGS. 2, 3B, and 6B, even though the silica particles maintain the same shape before being etched, the silica particles may be etched together with the substrate 110 and thus have different shape before being etched. However, for the convenience of explanation, in the drawings, the silica particles have the same shape before and after the etching process.

Since the substrate 110 is etched by using the silica particle layer 150 as a mask, patterns of the substrate 110 vary according to the distribution of the silica particles. The uneven part 160 is formed at the lower part of the silica particle layer 150. That is, the uneven part 160 is formed in an etching direction. At this time, the silica particle layer 150 may be removed in consideration of a factor such as the entire size of the semiconductor light emitting device 100. The removal of the silica particle layer 150 will be described below with reference to FIG. 6C.

When the patterned layer 190 including the silica particle layer 150 and the uneven part 160 is formed on the substrate 110, the first conductivity-type semiconductor layer 120 is grown on an upper surface of the patterned layer 190, and the active layer 130 and the second conductivity type semiconductor layer 140 are sequentially laminated thereon to thereby manufacture the semiconductor light emitting device 100.

Figure 4A:
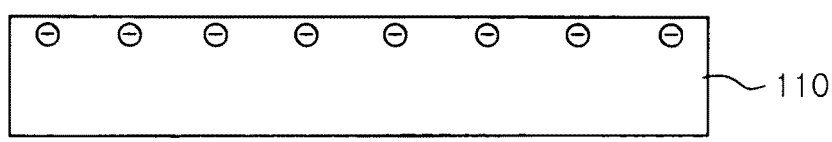
FIGS. 4A to 4C are views illustrating a method of forming a silica particle layer of FIG. 3B.
Figure 4B:
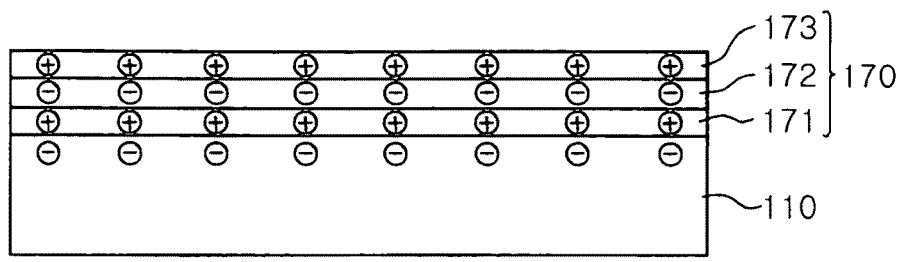
Figure 4C:
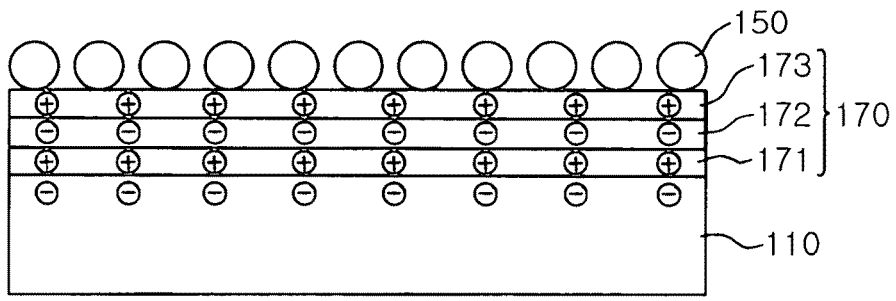

FIGS. 4A to 4C are views illustrating a method of forming the silica particle layer of FIG. 3B. In particular, a method of forming the silica particle layer 150 into a monolayer at the substrate 110 is described.

In FIG. 4A, the substrate 110 that is negatively (−) charged is shown. In order to negatively (−) charge the substrate 110, one surface of the substrate 110 may be subjected to oxygen plasma and UV-ozone treatments. Once the substrate 110 is negatively (−) charged, a plurality of self assembly monolayers 170 having charges of different polarities are laminated onto the substrate 110.

When the silica particle is approximately 500 nm in diameter, the self assembly monolayer has a thickness of 1 to 2 nm. In order to form the self assembly monolayer 170, a material formed in a self assembly layer, which is a polymer electrolyte, is laminated onto the negatively (−) charged substrate 110. First, a material 171 formed in a self assembly monolayer having positive electric charges is laminated onto the substrate 110. An example of the material forming the self assembly monolayer having the positive electric charges may include PAH (poly (allylamine hydrochloride)). When positive and negative (−) (+) charges are present in the substrate 110, a material 172 formed in a self assembly monolayer having negative charges is laminated thereon. An example of the material formed in the self assembly monolayer having the negative charges may include PSS (poly(styrene sulfonate). Then, a PAH layer (+) is laminated thereon. As a result, charges in order of (−) (+) (−) (+) from the basis of the substrate are present in the substrate 110.

As shown in FIG. 4B, when a plurality of layers having different charges from each other are formed, the charges have an electrical force that allows silica colloids to be absorbed at an appropriate position of the substrate or the surface of the semiconductor layers while forming a monolayer. In FIG. 4C, the silica colloids are distributed in the form of a monolayer at the plurality of self assembly monolayers 171, 172, and 173. When the monolayer of the silica colloids is formed, the monolayer is dried to form the silica particle layer 150, which is a monolayer.

Figure 5:
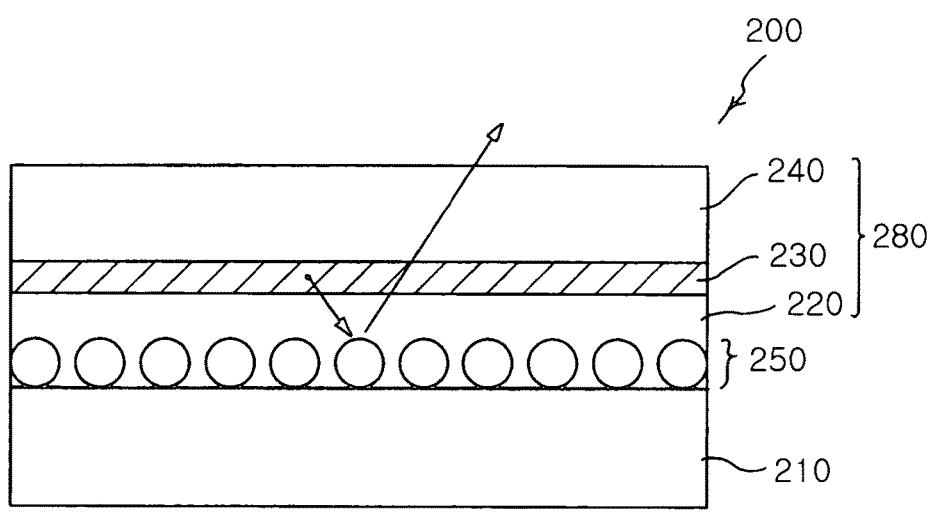
FIG. 5 is a cross-sectional view illustrating a semiconductor light emitting device according to another exemplary embodiment of the present invention.

FIG. 5 is a cross-sectional view illustrating a semiconductor light emitting device according to another exemplary embodiment of the invention. A semiconductor light emitting device 200 according to this embodiment of the invention includes a substrate 210 and a lamination 280 in which a first conductivity type semiconductor layer 220, an active layer 230, and a second conductivity type semiconductor layer 240 are sequentially laminated onto the substrate 210. A silica particle layer 250 is formed on the substrate 210. Since the substrate 210 and the lamination 280 are the same as those in FIG. 2, a description thereof will be omitted.

In this embodiment, the silica particle layer 250 is formed inside the semiconductor light emitting device 200. The silica particle layer 250 is a monolayer formed of the silica particles. The silica particle layer 250 is formed at the substrate 210. The lamination 280 is formed at the silica particle layer 250.

The silica particles of the silica particle layer 250 serve as surface crystal defects of the semiconductor layers to be grown at the substrate 210. When the first conductivity type semiconductor layer 220 is grown, surface defects can be reduced, and the grown first conductivity type semiconductor layer 220 has good crystalline quality, thereby increasing internal quantum efficiency. Further, as described above, the spherical silica particles reflect light generated from the active layer 230 and make the reflected light move toward a light emitting surface to thereby increase light extraction efficiency.

FIGS. 6A to 6E are views illustrating a method of manufacturing the semiconductor light emitting device according to another exemplary embodiment of the invention. Hereinafter, a description thereof will be made with reference to FIGS. 2 and 6A to 6E, and a description of the same components will be omitted.

A substrate 310 is prepared. A first conductivity-type semiconductor layer 320, an active layer 330, and a second conductivity-type semiconductor layer 340 are sequentially laminated. When the substrate 310 and a lamination 370 are prepared, a silica particle layer 350 is formed at a second conductivity-type semiconductor layer 340. The silica particle layer 350 is formed into a monolayer by the same method as that described in FIGS. 4A to 4C except that the silica particle layer 350 is formed at the second conductivity-type semiconductor layer 340 instead of at the substrate 310.

FIG. 6B is a photograph showing a surface of the silica particle layer 350 formed at the second conductivity-type semiconductor layer 340. In FIG. 6B, silica particles are enlarged in a small picture. The silica particle layer 350 is formed into a monolayer at a predetermined position of the second conductivity-type semiconductor layer 340.

Figure 6A:
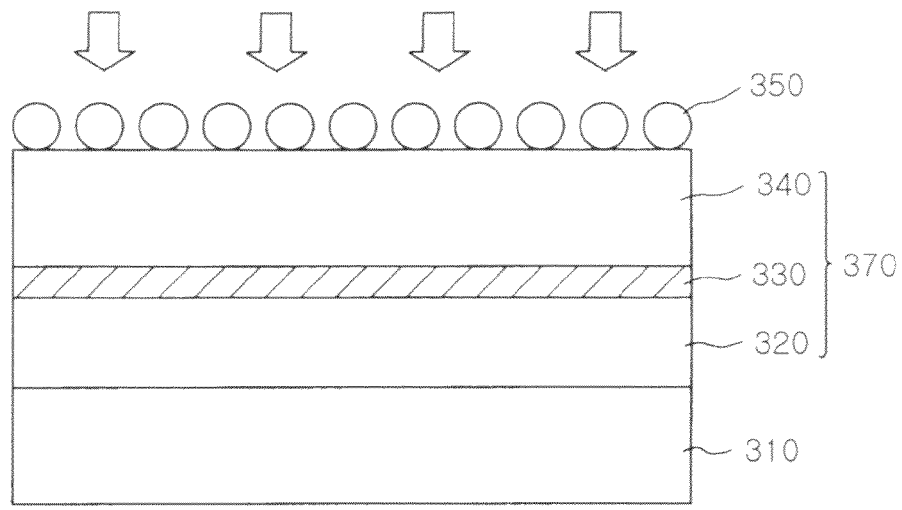
FIGS. 6A to 6E are views illustrating a method of manufacturing the semiconductor light emitting device according to another exemplary embodiment of the present invention.
Figure 6B:
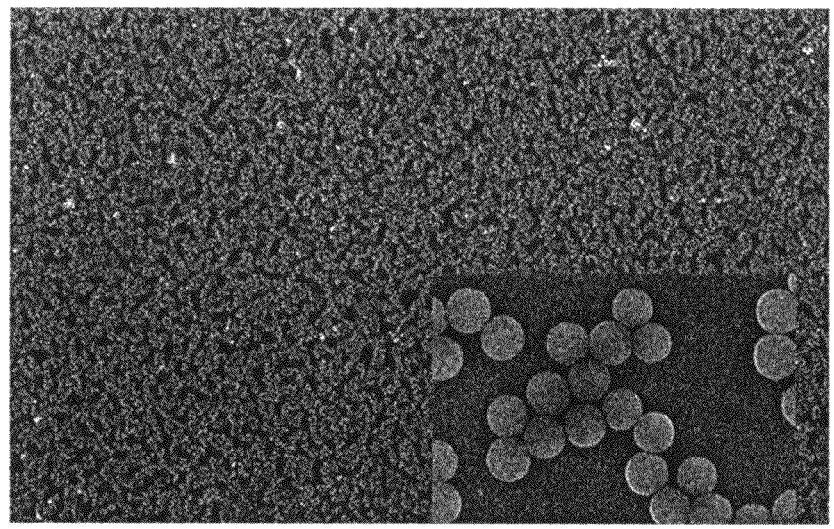
Figure 6C:
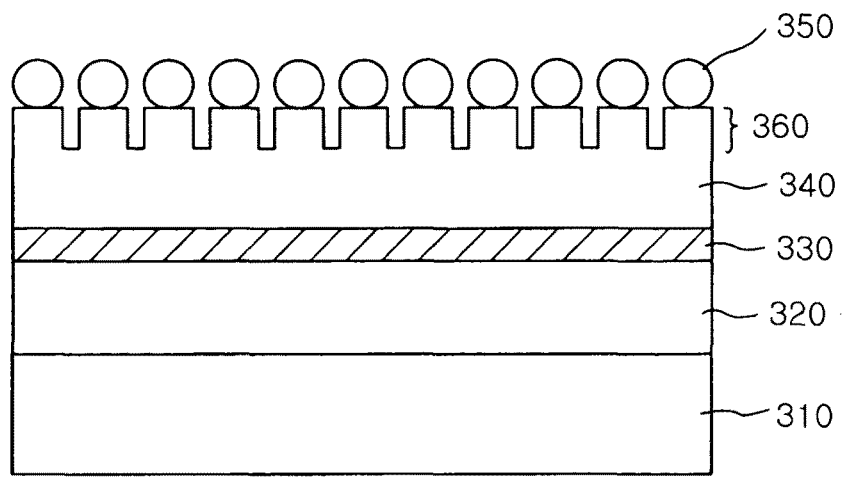

When the silica particle layer 350 is formed, as shown in FIG. 6A, the second conductivity-type semiconductor layer 340 is etched by using the silica particle layer 350 as a mask. Any etching method using the silica particle layer 150 as a mask may be used. As shown in FIG. 6B, plasma (indicated by an arrow) is applied to the silica particle layer 350 formed at the second conductivity-type semiconductor layer 340 to perform dry etching of the second conductivity-type semiconductor layer 340 (FIG. 6C).

The uneven part 360 is formed at a lower part of the silica particle layer 350. At this time, the silica particle layer 350 may be removed in consideration of a factor, such as the entire size of the semiconductor light emitting device 100. The silica particle layer 350 may be easily removed by using an acid such as HF.

Figure 6D:
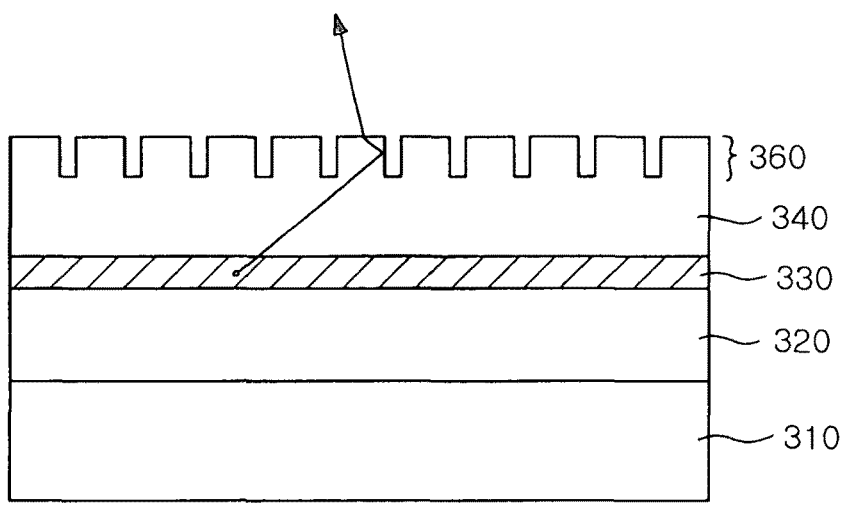
Figure 6E:
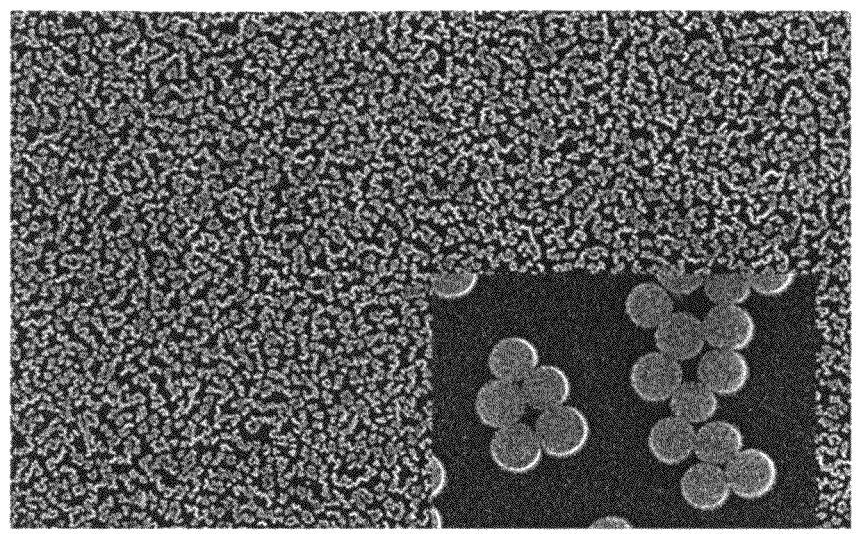

In FIG. 6D, the silica particle layer 350 is removed from the semiconductor light emitting device 300. When the silica particle layer 350 is removed, the uneven part 360 is only formed at the light emitting surface of the light generated from the semiconductor light emitting device 300. Light is generated from the active layer 330, moves inside the second conductivity-type semiconductor layer 340, and reaches the uneven part 360. The light is reflected off the uneven part 360 and extracted to the outside.

As set forth above, according to the exemplary embodiments of the invention, the semiconductor light emitting device includes the silica particle layer to obtain excellent light extraction efficiency by using a simple method. Further, since the uneven part can be formed on the semiconductor light emitting device without using expensive and complex equipment by using the method of forming the silica particle layer and using the silica particle layer as a mask, high reproducibility and high throughput can be obtained.

Further, since the size of the uneven part can be controlled by a simple process by using a method of controlling the size of silica particles so that the silica particles have a value close to or below the wavelength of the light generated from the LED, thereby realizing more effective method of manufacturing the semiconductor light emitting device.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device, comprising:
   a substrate having an uneven surface, the uneven surface having convex portions;
   a first conductivity type semiconductor layer, an active layer, and a second conductivity type semiconductor layer, which are sequentially laminated onto the uneven surface of the substrate; and
   a silica particle layer having a plurality of silica particles disposed only on convex portions of the uneven surface, wherein:
   the silica particles are directly in contact with the convex portions of the uneven surface,
   the silica particle layer is a monolayer to reflect light from the active layer,
   the plurality of silica particles have a spherical shape, and
   the convex portions have a cylindrical shape.

2. The semiconductor light emitting device of claim 1, wherein the substrate is any one of a sapphire substrate, a GaN substrate, a SiC substrate, and a ZnO substrate.

3. The semiconductor light emitting device of claim 1, wherein at least one of the silica particles has a diameter in the range of 100 to 1000 nm.

4. The semiconductor light emitting device of claim 1, wherein:
   the silica particle layer is disposed between the substrate and the first conductivity type semiconductor layer, and the uneven surface is defined on the surface of the substrate.

5. The semiconductor light emitting device of claim 1, wherein:
the uneven surface includes concave portions, and
the concave portions and the convex portion are alternately disposed to define the uneven surface.

6. The semiconductor light emitting device of claim 1, wherein sizes of the silica particles are less than or the same as the wavelength of the light from the active layer.

7. The semiconductor light emitting device of claim 1, wherein the silica particles have a lower refractive index than a refractive index of the active layer.

* * * * *